(12) United States Patent
Zhang

(10) Patent No.: US 12,361,549 B2
(45) Date of Patent: Jul. 15, 2025

(54) SYSTEMS AND METHODS FOR DETERMINING A RESOLUTION OF A DICTIONARY FOR A MAGNETIC RESONANCE FINGERPRINTING RECONSTRUCTION

(71) Applicant: SHENZHEN UNITED IMAGING RESEARCH INSTITUTE OF INNOVATIVE MEDICAL EQUIPMENT INNOVATION RESEARCH, Guangdong (CN)

(72) Inventor: Li Zhang, Shenzhen (CN)

(73) Assignee: SHENZHEN UNITED IMAGING RESEARCH INSTITUTE OF INNOVATIVE MEDICAL EQUIPMENT INNOVATION RESEARCH, Shenzhen (CN)

( * ) Notice: Subject to any disclaimer, the term of this patent is extended or adjusted under 35 U.S.C. 154(b) by 313 days.

(21) Appl. No.: 18/146,367

(22) Filed: Dec. 24, 2022

(65) Prior Publication Data
US 2023/0206436 A1    Jun. 29, 2023

(30) Foreign Application Priority Data
Dec. 24, 2021 (CN) .......... 202111602573.8

(51) Int. Cl.
*G06T 7/00*  (2017.01)
(52) U.S. Cl.
CPC .. *G06T 7/0012* (2013.01); *G06T 2207/10088* (2013.01)

(58) Field of Classification Search
CPC ......... G06T 7/0012; G06T 2207/10088; G06T 11/003; G06T 2210/41; G01R 33/561; G01R 33/50; G06N 3/126; A61B 5/055
See application file for complete search history.

(56) References Cited

U.S. PATENT DOCUMENTS

2020/0341089 A1* 10/2020 McGivney ......... G01R 33/5614

OTHER PUBLICATIONS

Tippareddy, C., Zhao, W., Sunshine, J.L. et al. "Magnetic resonance fingerprinting: an overview" Eur J Nucl Med Mol Imaging 48, 4189-4200 (2021). https://doi.org/10.1007/s00259-021-05384-2 (Year: 2021).*

(Continued)

*Primary Examiner* — Kent Yip
(74) *Attorney, Agent, or Firm* — Poseidon Advanced IP LLC

(57) ABSTRACT

The present disclosure is related to systems and methods for determining a resolution of a dictionary for a magnetic resonance fingerprinting (MRF) reconstruction. The method includes obtaining one or more tissue properties; determining an image resolution condition based on an image resolution of the MRF reconstruction; and determining, based on a fitness function and the image resolution condition, a target step size for each of the one or more tissue properties. The target step size for the each of the one more tissue properties is an optimal solution of the fitness function, which represents an imaging velocity of the MRF reconstruction. The target step size for the each of the one more tissue properties satisfies the image resolution condition.

20 Claims, 7 Drawing Sheets

(56) References Cited

OTHER PUBLICATIONS

J. I. Hamilton and N. Seiberlich, "Machine Learning for Rapid Magnetic Resonance Fingerprinting Tissue Property Quantification," in Proceedings of the IEEE, vol. 108, No. 1, pp. 69-85, Jan. 2020, doi: 10.1109/JPROC.2019.2936998. (Year: 2019).*

Badve, C., Ma, D. (2023). Magnetic Resonance Fingerprinting. In: Faro, S.H., Mohamed, F.B. (eds) Functional Neuroradiology. Springer, Cham. https://doi.org/10.1007/978-3-031-10909-6_53 (Year: 2023).*

* cited by examiner

SYSTEMS AND METHODS FOR DETERMINING A RESOLUTION OF A DICTIONARY FOR A MAGNETIC RESONANCE FINGERPRINTING RECONSTRUCTION

CROSS-REFERENCE TO RELATED APPLICATIONS

This application claims priority of Chinese Patent Application No. 202111602573.8, filed on Dec. 24, 2021, the contents of which are hereby incorporated by reference.

TECHNICAL FIELD

This disclosure generally relates to systems and methods for magnetic resonance fingerprinting (MRF) reconstructions, and more particularly, relates to systems and methods for determining a resolution of a dictionary for a magnetic resonance fingerprinting (MRF) reconstruction.

BACKGROUND

Magnetic Resonance Fingerprinting (MRF) is an approach to quantitative magnetic resonance imaging that allows simultaneous measurement of multiple tissue properties in a single, time-efficient acquisition. In an MRF reconstruction, an MR dictionary that includes signal evolutions for different tissue properties (e.g., a spin-lattice relaxation (T1), a spin-spin relaxation (T2), a proton density (p), a diffusion relaxation (D), a repetition time (TR), a flip angle (FA), a magnetic field strength difference caused by inhomogeneity of the main magnetic field ($\Delta B_0$), etc.) or different tissue property combinations may be generated. Existing MR dictionaries are often generated based on a step size of each tissue property determined by a user (e.g., a device operator or a doctor). However, an existing MR dictionary with a large size usually results in a low imaging velocity; and an existing MR dictionary with a small size usually results in a low image resolution. Thus, it is desirable to develop methods and systems for determining a target step size for each tissue property to effectively solve or diminish such problems.

SUMMARY

According to an aspect of the present disclosure, a system for determining a resolution of a dictionary for a magnetic resonance fingerprinting (MRF) reconstruction is provided. The system may include at least one storage device including a set of instructions; and at least one processor in communication with the at least one storage device, wherein when executing the set of instructions. The at least one processor may be directed to cause the system to perform operations including: obtaining one or more tissue properties; determining an image resolution condition based on an image resolution of the MRF reconstruction; and determining, based on a fitness function and the image resolution condition, a target step size for each of the one or more tissue properties. The target step size for the each of the one more tissue properties may be an optimal solution of the fitness function, which represents an imaging velocity of the MRF reconstruction, and the target step size for the each of the one more tissue properties satisfies the image resolution condition.

In some embodiments, the determining, based on the fitness function and the image resolution condition, the target step size for the each of the one or more tissue properties includes: generating a first data set including one or more candidate step sizes each of which corresponds to a tissue property of the one or more tissue properties; determining a value of the fitness function based on the one or more candidate step sizes; and determining the target step size for the each of the one or more tissue properties by performing a plurality of iterations on the first data set until the image resolution condition is satisfied.

In some embodiments, the performing the plurality of iterations on the first data set includes: selecting, from the first data set, a candidate step size combination; transforming the candidate step size combination to obtain a second data set; and updating the first data set based on the second data set.

In some embodiments, the selecting, from the first data set, the candidate step size combination includes selecting the candidate step size combination based on an evaluation value of the candidate step size combination, wherein the evaluation value is associated with a candidate imaging velocity or a candidate image resolution contributed by the candidate step size combination.

In some embodiments, the selecting, from the first data set, the candidate step size combination includes selecting the candidate step size combination based on an iteration count of iterations during which the candidate step size combination is within the first data set.

In some embodiments, the transforming the candidate step size combination includes: determining a target transformation process to transform the candidate step size combination based on a transformation probability; and obtaining the second data set by performing the target transformation process on the candidate step size combination.

In some embodiments, the transformation probability is determined based on an evaluation value of the candidate step size combination, wherein the evaluation value is associated with a candidate imaging velocity or a candidate image resolution contributed by the candidate step size combination.

In some embodiments, the target transformation process is a crossover process, and the obtaining the second data set by performing the target transformation process on the candidate step size combination includes: selecting, from the first data set, a second candidate step size combination based on a weighted evaluation value of the second candidate step size combination; and obtaining the second data set by hybridizing the candidate step size combination and the second candidate step size combination.

In some embodiments, the updating the first data set based on the second data set includes: determining an evaluation value of the first data set; determining a transformed evaluation value of the second data set; and determining an updated first data set based on the evaluation value of the first data set and the transformed evaluation value of the second data set.

In some embodiments, an evaluation value of the first data set or a transformed evaluation value of the second data set is determined based on the fitness function.

In some embodiments, the fitness function includes a plurality of weights respectively corresponding to the one or more tissue properties.

In some embodiments, the operations further includes determining a dictionary based on the target step size for the each of the one or more tissue properties.

According to another aspect of the present disclosure, a method for determining a resolution of a dictionary for a magnetic resonance fingerprinting (MRF) reconstruction may include obtaining one or more tissue properties; determining an image resolution condition based on an image resolution of the MRF reconstruction; and determining, based on a fitness function and the image resolution condition, a target step size for each of the one or more tissue properties. The target step size for the each of the one more tissue properties may be an optimal solution of the fitness function, which represents an imaging velocity of the MRF reconstruction, and the target step size for the each of the one more tissue properties satisfies the image resolution condition.

According to still another aspect of the present disclosure, a non-transitory computer readable medium may include at least one set of instructions. When executed by at least one processor of a computing device, the at least one set of instructions may cause the at least one processor to effectuate a method. The method may include obtaining one or more tissue properties; determining an image resolution condition based on an image resolution of the MRF reconstruction; and determining, based on a fitness function and the image resolution condition, a target step size for each of the one or more tissue properties. The target step size for the each of the one more tissue properties may be an optimal solution of the fitness function, which represents an imaging velocity of the MRF reconstruction, and the target step size for the each of the one more tissue properties satisfies the image resolution condition.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
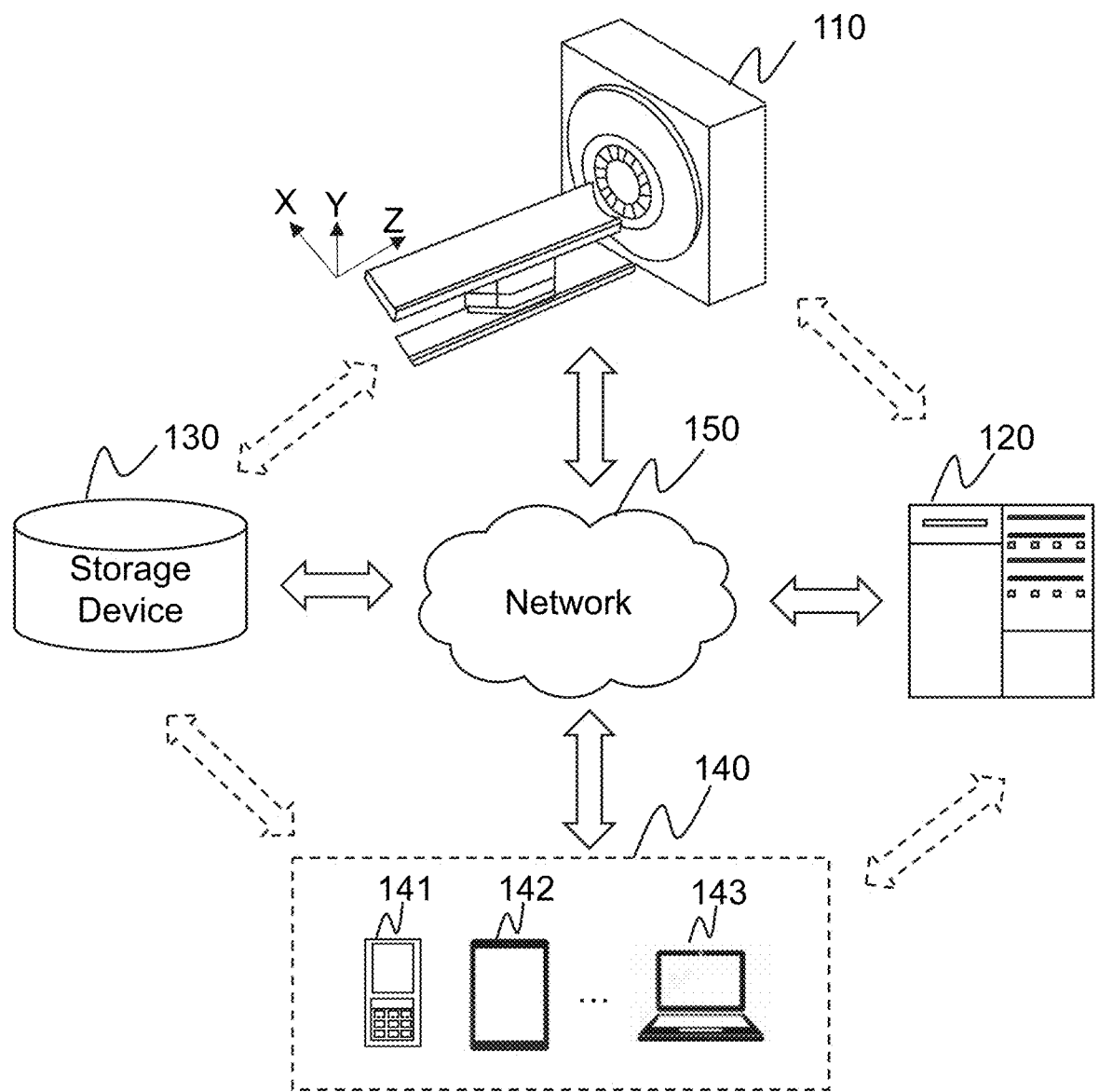
FIG. 1 is a schematic diagram illustrating an exemplary image processing system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The term "image" in the present disclosure is used to collectively refer to image data (e.g., scan data, projection data) and/or images of various forms, including a two-dimensional (2D) image, a three-dimensional (3D) image, a four-dimensional (4D), etc. The term "pixel" and "voxel" in the present disclosure are used interchangeably to refer to an element of an image. The term "anatomical structure" in the present disclosure may refer to gas (e.g., air), liquid (e.g., water), solid (e.g., stone) cell, tissue, organ of a subject, or any combination thereof, which may be displayed in an image and really exist in or on the subject's body. The term "region," "location," and "area" in the present disclosure may refer to a location of an anatomical structure shown in the image or an actual location of the anatomical structure existing in or on the subject's body, since the image may indicate the actual location of a certain anatomical structure existing in or on the subject's body. The term "an image of a subject" may be referred to as the subject for brevity.

For illustration purposes, the following description is provided to help better understanding an image registration process. It is understood that this is not intended to limit the scope of the present disclosure. For persons having ordinary skills in the art, a certain amount of variations, changes and/or modifications may be deducted under the guidance of the present disclosure. Those variations, changes and/or modifications do not depart from the scope of the present disclosure.

An aspect of the present disclosure relates to systems and methods for determining a target step size for a tissue property for a magnetic resonance fingerprinting (MRF) reconstruction. In some embodiments, the systems and methods may obtain one or more tissue properties. The systems and methods may determine an image resolution condition based on an image resolution of the MRF reconstruction and determine, based on a fitness function and the image resolution condition, a target step size for each of the one or more tissue properties. In some embodiments, the target step size for the each of the one more tissue properties may be an optimal solution of the fitness function. The fitness function may represent an imaging velocity of the MRF reconstruction, and the target step size for the each of the one more tissue properties may satisfy the image resolution condition. According to some embodiments of the present disclosure, the target step size of the each of the one more tissue properties may be the solution of the fitness function when the image resolution condition is satisfied and the imaging time is the minimum. Thus, a size of a MRF dictionary generated based on the target step size of the each of the one more tissue properties may be neither too large such that the imaging velocity is limited, nor too small such that the image resolution is low. Thus, the imaging velocity and the image resolution may be optimized synchronously.

FIG. 1 is a schematic diagram illustrating an exemplary image processing system according to some embodiments of the present disclosure. As shown, the image processing system 100 may include a medical device 110, a processing device 120, a storage device 130, one or more terminal(s) 140, and a network 150. In some embodiments, the medical device 110, the processing device 120, the storage device 130, and/or the terminal(s) 140 may be connected to and/or communicate with each other via a wireless connection (e.g., the network 150), a wired connection, or a combination thereof. The image processing system 100 may include various types of connections between its components. For example, the medical device 110 may be connected to the processing device 120 through the network 150, or connected to the processing device 120 directly as illustrated by the bidirectional dotted arrow connecting the medical device 110 and the processing device 120 in FIG. 1. As another example, the terminal(s) 140 may be connected to the processing device 120 through the network 150, or connected to the processing device 120 directly as illustrated by the bidirectional dotted arrow connecting the terminal(s) 140 and the processing device 120 in FIG. 1. As still another example, the storage device 130 may be connected to the medical device 110 through the network 150, or connected to the medical device 110 directly as illustrated by the bidirectional dotted arrow connecting the medical device 110 and the storage device 130 in FIG. 1. As still another example, the storage device 130 may be connected to the terminal(s) 140 through the network 150, or connected to the terminal(s) 140 directly as illustrated by the bidirectional dotted arrow connecting the terminal(s) 140 and the storage device 130 in FIG. 1.

The medical device 110 may be configured to acquire imaging data relating to a subject. The imaging data relating to a subject may include an image (e.g., an image slice), projection data, or a combination thereof. In some embodiments, the imaging data may be a two-dimensional (2D) imaging data, a three-dimensional (3D) imaging data, a four-dimensional (4D) imaging data, or the like, or any combination thereof. The subject may be biological or non-biological. For example, the subject may include a patient, a man-made object, etc. As another example, the subject may include a specific portion, an organ, and/or tissue of the patient. Specifically, the subject may include the head, the neck, the thorax, the heart, the stomach, a blood vessel, soft tissue, a tumor, or the like, or any combination thereof. In the present disclosure, "object" and "subject" are used interchangeably. For illustration purposes, a coordinate system as shown in FIG. 1 is introduced. The coordinate system may include an X-axis, a Y-axis, and a Z-axis. The Y-axis may refer to a direction perpendicular to a bed of the medical device 110. The Z-axis may refer to a long axis of the bed. The X-axis may refer to a short axis of the bed.

In some embodiments, the medical device 110 may include a single modality imaging device. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

In some embodiments, the medical device 110 may transmit the image(s) via the network 150 to the processing device 120, the storage device 130, and/or the terminal(s) 140. For example, the image(s) may be sent to the processing device 120 for further processing or may be stored in the storage device 130.

The processing device 120 may process data and/or information obtained from the medical device 110, the storage device 130, and/or the terminal(s) 140. For example, the processing device 120 may obtain one or more tissue properties. As another example, the processing device 120 may determine an image resolution condition based on an image resolution of the MRF reconstruction. As still another example, the processing device 120 may determine, based on a fitness function and the image resolution condition, a target step size for each of the one or more tissue properties. In some embodiments, the target step size for the each of the one more tissue properties may be an optimal solution of the fitness function. The fitness function may represent an imaging velocity of the MRF reconstruction, and the target step size for the each of the one or more tissue properties may satisfy the image resolution condition.

In some embodiments, the processing device 120 may be a single server or a server group. The server group may be centralized or distributed. In some embodiments, the processing device 120 may be local or remote. For example, the processing device 120 may access information and/or data from the medical device 110, the storage device 130, and/or the terminal(s) 140 via the network 150. As another example, the processing device 120 may be directly connected to the medical device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal 140. In some embodiments, the processing device 120 may be part of the medical device 110.

The storage device 130 may store data, instructions, and/or any other information. In some embodiments, the storage device 130 may store data obtained from the medical device 110, the processing device 120, and/or the terminal(s) 140. The data may include image data acquired by the processing device 120, algorithms and/or models for processing the image data, etc. For example, the storage device 130 may store image sets of a subject obtained from a medical device (e.g., the medical device 110). As another example, the storage device 130 may store a target image of the image sets determined by the processing device 120. In some embodiments, the storage device 130 may store data and/or instructions that the processing device 120, and/or the terminal 140 may execute or use to perform exemplary methods described in the present disclosure. In some embodiments, the storage device 130 may include a mass storage, removable storage, a volatile read-and-write memory, a read-only memory (ROM), or the like, or any combination thereof. Exemplary mass storages may include a magnetic disk, an optical disk, a solid-state drive, etc. Exemplary removable storages may include a flash drive, a floppy disk, an optical disk, a memory card, a zip disk, a magnetic tape, etc. Exemplary volatile read-and-write memories may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the image processing system 100

(e.g., the processing device 120, the terminal(s) 140). One or more components in the image processing system 100 may access the data or instructions stored in the storage device 130 via the network 150. In some embodiments, the storage device 130 may be integrated into the medical device 110 or the terminal(s) 140.

The terminal(s) 140 may be connected to and/or communicate with the medical device 110, the processing device 120, and/or the storage device 130. In some embodiments, the terminal 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal 140 may include an input device, an output device, etc. The input device may include alphanumeric and other keys that may be input via a keyboard, a touchscreen (for example, with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the image processing system 100. In some embodiments, one or more components of the image processing system 100 (e.g., the medical device 110, the processing device 120, the storage device 130, the terminal(s) 140, etc.) may communicate information and/or data with one or more other components of the image processing system 100 via the network 150. For example, the processing device 120 and/or the terminal 140 may obtain image data from the medical device 110 via the network 150. As another example, the processing device 120 and/or the terminal 140 may obtain information stored in the storage device 130, or a storage device external to the image processing system 100, via the network 150. The network 150 may be and/or include a public network (e.g., the Internet), a private network (e.g., a local area network (LAN), a wide area network (WAN), etc.), a wired network (e.g., an Ethernet network), a wireless network (e.g., a Wi-Fi network), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the image processing system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure. In some embodiments, the image processing system 100 may include one or more additional components and/or one or more components of the image processing system 100 described above may be omitted. Additionally or alternatively, two or more components of the image processing system 100 may be integrated into a single component. A component of the image processing system 100 may be implemented on two or more sub-components.

Figure 2:
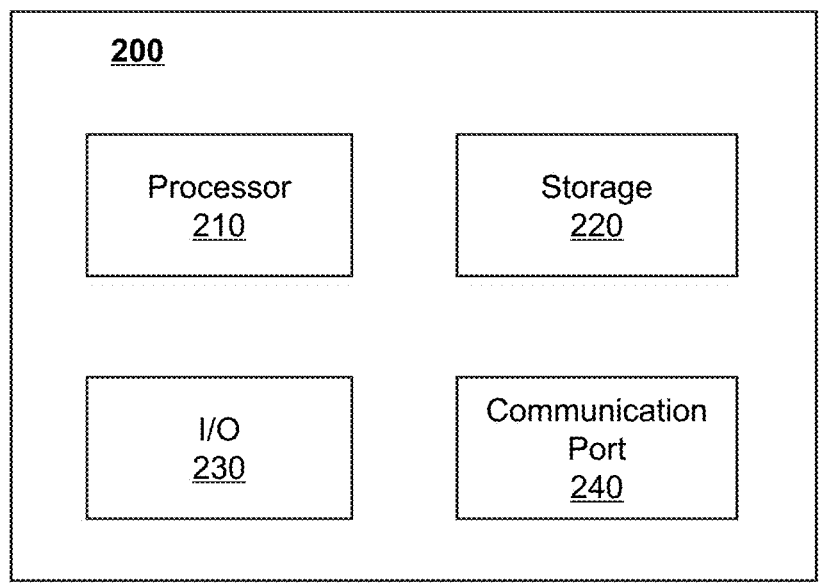
FIG. 2 is a schematic diagram illustrating exemplary hardware and/or software components of an exemplary computing device on which a processing device may be implemented according to some embodiments of the present disclosure.

FIG. 2 is a schematic diagram illustrating exemplary hardware and/or software components of an exemplary computing device on which the processing device 120 may be implemented according to some embodiments of the present disclosure. As illustrated in FIG. 2, a computing device 200 may include a processor 210, a storage 220, an input/output (I/O) 230, and a communication port 240.

The processor 210 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 210 may process image data obtained from the medical device 110, the terminal(s) 140, the storage device 130, and/or any other component of the image processing system 100. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combination thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the medical device 110, the terminal(s) 140, the storage device 130, and/or any other component of the image processing system 100. The storage 220 may be similar to the storage device 130 described in connection with FIG. 1, and the detailed descriptions are not repeated here.

The I/O 230 may input and/or output signals, data, information, etc. In some embodiments, the I/O 230 may enable a user interaction with the processing device 120. In some embodiments, the I/O 230 may include an input device and an output device. Examples of the input device may include a keyboard, a mouse, a touchscreen, a microphone, a sound recording device, or the like, or a combination thereof. Examples of the output device may include a display device, a loudspeaker, a printer, a projector, or the like, or a combination thereof. Examples of the display device may include a liquid crystal display (LCD), a light-emitting diode (LED)-based display, a flat panel display, a curved screen, a television device, a cathode ray tube (CRT), a touchscreen, or the like, or a combination thereof.

The communication port 240 may be connected to a network (e.g., the network 150) to facilitate data communications. The communication port 240 may establish connections between the processing device 120 and the medical device 110, the terminal(s) 140, and/or the storage device 130. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G), or the like, or any combination thereof. In some embodiments, the communication port 240 may be and/or include a standardized communication port, such as RS232, RS485. In some embodiments, the communication port 240 may be a specially designed communication port. For example, the communication port 240 may be designed in accordance with the digital imaging and communications in medicine (DICOM) protocol.

Figure 3:
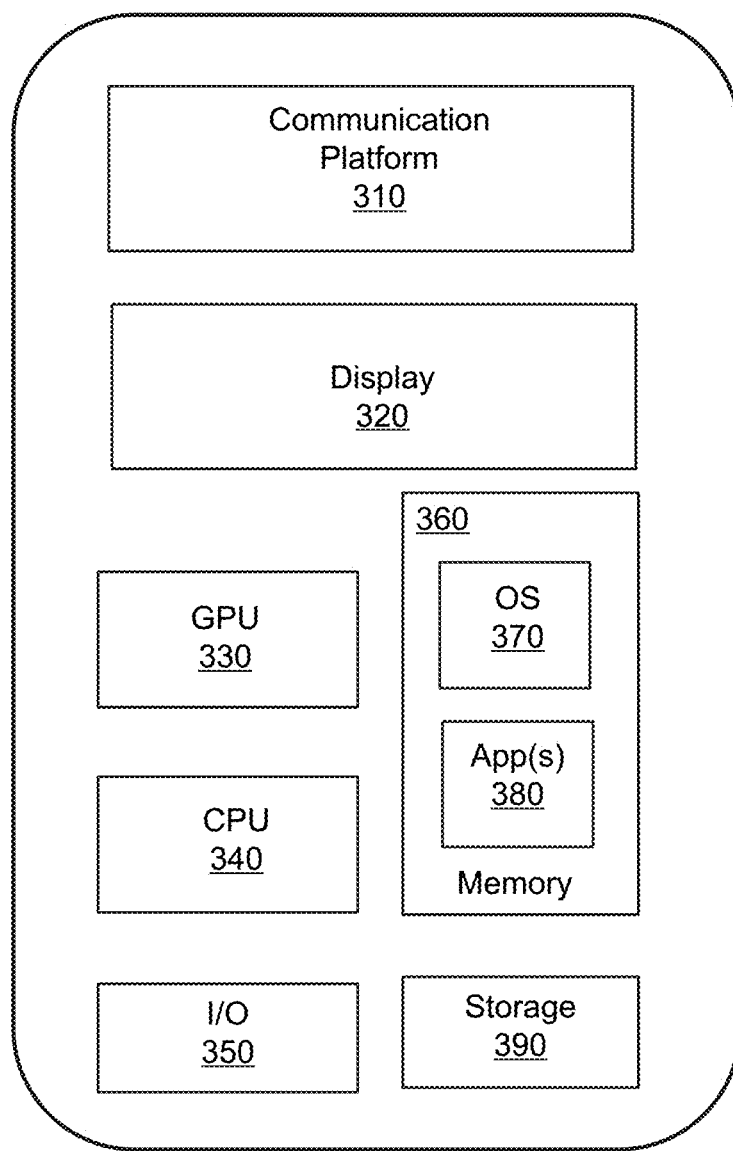
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device according to some embodiments of the present disclosure. In some embodiments, the terminal(s) 140 and/or the processing device 120 may be implemented on a mobile device 300, respectively.

As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300.

In some embodiments, the communication platform 310 may be configured to establish a connection between the mobile device 300 and other components of the image processing system 100, and enable data and/or signal to be transmitted between the mobile device 300 and other components of the image processing system 100. For example, the communication platform 310 may establish a wireless connection between the mobile device 300 and the medical device 110, and/or the processing device 120. The wireless connection may include, for example, a Bluetooth™ link, a Wi-Fi™ link, a WiMax™ link, a WLAN link, a ZigBee link, a mobile network link (e.g., 3G, 4G, 5G), or the like, or any combination thereof. The communication platform 310 may also enable the data and/or signal between the mobile device 300 and other components of the image processing system 100. For example, the communication platform 310 may transmit data and/or signals inputted by a user to other components of the image processing system 100. The inputted data and/or signals may include a user instruction. As another example, the communication platform 310 may receive data and/or signals transmitted from the processing device 120. The received data and/or signals may include imaging data acquired by the medical device 110.

In some embodiments, a mobile operating system (OS) 370 (e.g., iOS™, Android™, Windows Phone™, etc.) and one or more applications (App(s)) 380 may be loaded into the memory 360 from the storage 390 in order to be executed by the CPU 340. The applications 380 may include a browser or any other suitable mobile apps for receiving and rendering information from the processing device 120. User interactions with the information stream may be achieved via the I/O 350 and provided to the processing device 120 and/or other components of the image processing system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 4:
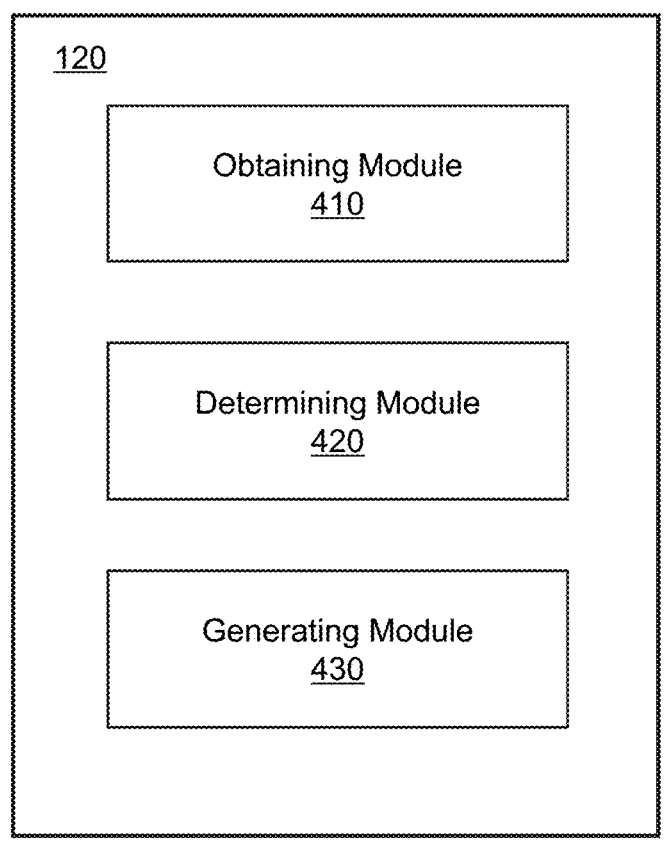
FIG. 4 is a block diagram illustrating an exemplary processing device according to some embodiments of the present disclosure.

FIG. 4 is a block diagram illustrating an exemplary processing device according to some embodiments of the present disclosure. In some embodiments, the processing device 120 may include an obtaining module 410, a determining module 420, and a generating module 430.

The obtaining module 410 may be configured to obtain data and/or information associated with the image processing system 100. In some embodiments, the obtaining module 410 may obtain one or more tissue properties.

The determining module 420 may be configured to determine data and/or information associated with the image processing system 100. In some embodiments, the determining module 420 may determine an image resolution condition based on an image resolution of the MRF reconstruction. More descriptions regarding determining the image resolution condition may be found elsewhere in the present disclosure. See, e.g., FIG. 5 and the descriptions thereof.

The generating module 430 may be configured to generate a MRF dictionary.

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more modules may be added or omitted in the processing device 120. For example, the processing device 120 may further include a storage module (not shown in FIG. 4) configured to store data and/or information associated with the image processing system 100. In some embodiments, two or more modules may be integrated into a single module. For example, the determining module 420 and the generating module 430 may be integrated into a single module.

Figure 5:
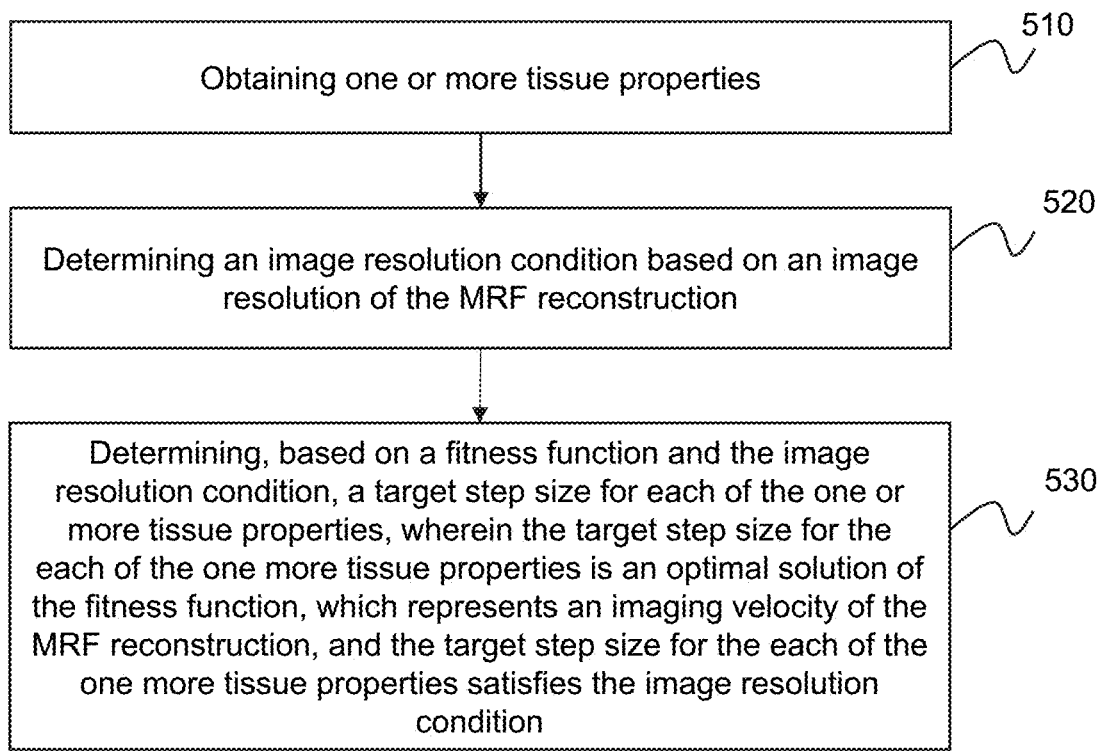
FIG. 5 is a flowchart illustrating an exemplary process for determining a target step size for a tissue property according to some embodiments of the present disclosure.

FIG. 5 is a flowchart illustrating an exemplary process 500 for determining a target step size for a tissue property according to some embodiments of the present disclosure. In some embodiments, the process 500 may be implemented in the image processing system 100 illustrated in FIG. 1. For example, the process 500 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 510, the processing device 120 (e.g., the obtaining module 410) may obtain one or more tissue properties.

In some embodiments, the one or more tissue properties may include a spin-lattice relaxation (T1), a spin-spin relaxation (T2), a proton density (p), a diffusion relaxation (D), a repetition time (TR), a flip angle (FA), a magnetic field strength difference caused by inhomogeneity of a main magnetic field ($\Delta B_0$), or the like, or any combination thereof. In some embodiments, the one or more tissue properties may be predetermined by an operator and/or stored in a storage device (e.g., the storage device 130, the storage 220, the storage 390, etc.). In some embodiments, the processing device 120 may obtain the one or more tissue properties from the storage device.

In some embodiments, the processing device 120 may further obtain a range of values of each of the one or more tissue properties. For example, a range of values of the spin-lattice relaxation may be 700 ms-4200 ms. As another example, a range of values of the spin-spin relaxation may be 50 ms-2100 ms. As still another example, a range of values of the proton density may be 0.6-0.9. In some embodiments, the range of values of the each of the one or more tissue properties may be predetermined by an operator and/or stored in a storage device (e.g., the storage device 130, the storage 220, the storage 390, etc.), and may be obtained from the storage device.

In 520, the processing device 120 (e.g., the determining module 420) may determine an image resolution condition based on an image resolution of the MRF reconstruction.

In some embodiments, the image resolution may be a required image resolution of the MRF reconstruction. For example, the image resolution may define a minimum resolution of an image that is reconstructed based on the MRF reconstruction. In some embodiments, the image resolution may be predetermined and stored in a storage device (e.g., the storage device 130, the storage 220, the storage 390, etc.), and may be obtained from the storage device. In some embodiments, the image resolution of the MRF reconstruction may be associated with a step size of each tissue property of the one or more tissue properties. For a certain range of values of a tissue property of the one or more tissue properties, the less the step size thereof, the greater the image resolution. In some embodiments, the processing device 120 may determine the image resolution condition based on the image resolution of the MRF reconstruction. For example, the processing device 120 may determine an image resolution function based on the one or more tissue properties. Merely by way of examples, the one or more tissue properties may include three tissue properties including a spin-lattice relaxation, a spin-spin relaxation, and a proton density. The image resolution function may be P(x, y,z), where x, y, and z represents variables of step sizes of the spin-lattice relaxation, the spin-spin relaxation, and the proton density, respectively. In some embodiments, the image resolution condition may include that the image resolution function P(x,y,z) is greater than the required image resolution of the MRF reconstruction.

In 530, the processing device 120 (e.g., the determining module 420) may determine, based on a fitness function and the image resolution condition, a target step size for each of the one or more tissue properties.

In some embodiments, the fitness function may represent an imaging velocity of the MRF reconstruction. In some embodiments, the imaging velocity may be associated with a step size of each tissue property of the one or more tissue properties. For example, for a certain range of values of a tissue property of the one or more tissue properties, the less the step size thereof, the less imaging velocity. In some embodiments, the processing device 120 may determine the fitness function based on the step size of each tissue property of the one or more tissue properties. For example, the one or more tissue properties may include three tissue properties including a spin-lattice relaxation, a spin-spin relaxation, and a proton density. The fitness function may be determined according to Equation (1):

$$f(x,y,z)=T1(x)*T2(y)*\rho(z) \quad (1),$$

where f(x,y,z) denotes the fitness function; x, y, and z represents variables of step sizes of the spin-lattice relaxation, the spin-spin relaxation, and the proton density, respectively; T1(x) denotes an imaging velocity function associated with the step size of the spin-lattice relaxation, T2(y) denotes an imaging velocity function associated with the step size of the spin-spin relaxation, and $\rho(z)$ denotes an imaging velocity function associated with the step size of the proton density.

In some embodiments, the fitness function may include a plurality of weights respectively corresponding to the one or more tissue properties. A weight of a tissue property of the one or more tissue properties may represent an important degree of the tissue property considered when determining the imaging velocity. For example, the greater weight of a tissue property, the more important the tissue property is when determining the imaging velocity. Merely by way of example, the one or more tissue properties may include three tissue properties including a spin-lattice relaxation, a spin-spin relaxation, and a proton density. The fitness function may be determined according to Equation (2):

$$f(x,y,z)=T1(x,w1)*T2(y,w2)*p(z,w3) \quad (2),$$

where f(x,y,z) denotes the fitness function; x, y, and z represents variables of step sizes of the spin-lattice relaxation, the spin-spin relaxation, and the proton density, respectively; T1(x, w1) denotes an imaging velocity function associated with the step size of the spin-lattice relaxation and a weight of the spin-lattice relaxation; T2(y, w2) denotes an imaging velocity function associated with the step size of the spin-spin relaxation and a weight of the spin-spin relaxation; $\rho(z, w3)$ denotes an imaging velocity function associated with the step size of the proton density and a weight of the proton density; w1 denotes the weight of the spin-lattice relaxation; w2 denotes the weight of the spin-spin relaxation; and w3 denotes the weight of the proton density.

In some embodiments, the plurality of weights respectively corresponding to the one or more tissue properties may be predetermined by an operator and/or stored in a storage device (e.g., the storage device 130, the storage 220, the storage 390, etc.), and may be obtained from the storage device. For example, a sum of the plurality of weights respectively corresponding to the one or more tissue properties may be 1. A weight of each of the one or more tissue properties may be assigned with a different value. For example, in Equation (2), a sum of the weight w1, the weight w2, and the weight w3 may be 1. The weight w1 may be 0.5, the weight w2 may be 0.3, and the weight w3 may be 0.2.

In some embodiments, the processing device 120 may determine, based on the fitness function and the image resolution condition, the target step size for each of the one or more tissue properties. For example, the target step size for the each of the one more tissue properties may satisfy the image resolution condition and may be an optimal solution of the fitness function. The optimal solution of the fitness function may be a solution when the fitness function has a greatest value and when the solution satisfies the image resolution condition. The optimal solution may reflect a target step size combination that includes a target step size of each of the one or more tissue properties when the imaging velocity is the greatest if the image resolution condition is satisfied.

For example, the one or more tissue properties include three tissue properties including a spin-lattice relaxation, a spin-spin relaxation, and a proton density as exampled in Equation (1) or Equation (2), the processing device 120 may determine the optimal solution of argmax(f(x,y,z)) if the image resolution function P(x,y,z) is greater than the required image resolution of the MRF reconstruction, where f(x,y,z) denotes a fitness function illustrated in Equation (1) or Equation (2). In some embodiments, the processing device 120 may perform a plurality of iteration processes on the argmax(f(x,y,z)) when the image resolution function P(x,y,z) is greater than the required image resolution to determine the optimal solution. The processing device 120 may designate the optimal solution as the target step size of each of the one or more tissue properties. In some embodiments, the processing device 120 may determine the optimal solution according to a predetermined algorithm (e.g., a Genetic algorithm, etc.). Exemplary processes for determining the target step size for each of the one or more tissue properties may be found elsewhere (e.g., FIGS. 7-10 and the descriptions thereof) of the present disclosure.

Figure 6:
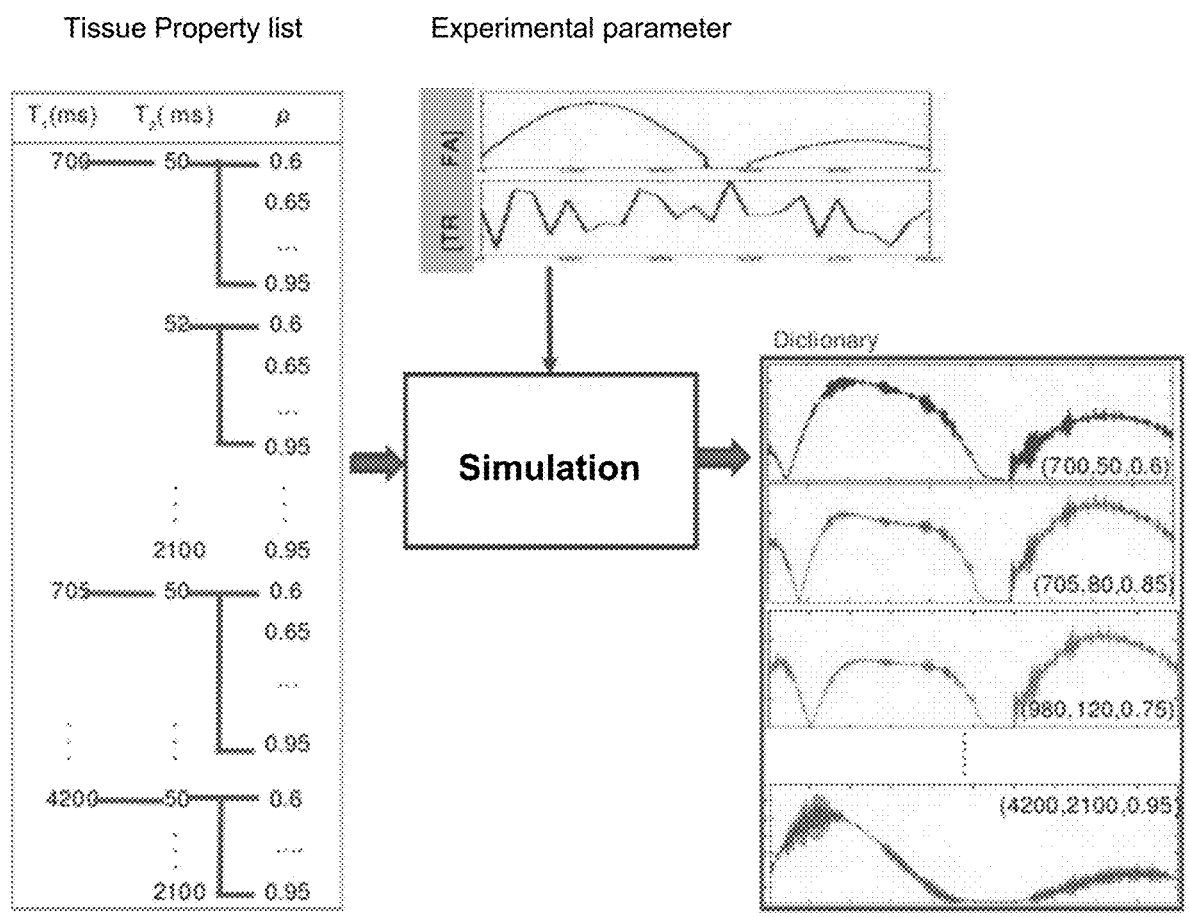
FIG. 6 is a schematic diagram illustrating an exemplary dictionary according to some embodiments of the present disclosure.

In some embodiments, after determining the target step size for each of the one or more tissue properties, the processing device 120 (e.g., the generating module 430) may generate a dictionary (also referred to as a MRF dictionary) based on the target step size for each of the one or more tissue properties and the range of values of each of the one or more tissue properties. In some embodiments, a plurality of tissue property combinations may be generated based on the target step size for each of the one or more tissue properties and the range of values of each of the one or more tissue properties. For example, the one or more tissue properties include a spin-lattice relaxation, a spin-spin relaxation, and a proton density. The range of values of the spin-lattice relaxation may be [700 ms, 4200 ms], and a target step size of the spin-lattice relaxation may be 5 ms. The range of values of the spin-spin relaxation may be [50 ms, 2100 ms], and a target step size of the spin-lattice relaxation may be 2 ms. The range of values of the proton density may be [0.6, 0.95], and a target step size of the spin-lattice relaxation may be 0.05. Each of the plurality of tissue property combinations may include a possible value of each of the three tissue properties. In some embodiments, the processing device 120 may perform a simulation on the plurality of tissue property combinations and experimental parameters to obtain signal evolutions for the plurality of tissue property combinations. FIG. 6 is a schematic diagram illustrating an exemplary dictionary according to some embodiments of the present disclosure. As shown in FIG. 6, the dictionary may include signal evolutions for each of the plurality of tissue property combinations. In some embodiments, the dictionary may be configured to reconstruct a MRF image.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the dictionary may be stored in a storage device (e.g., the storage device 130, the storage 220, the storage 390, etc.), and may be obtained from the storage device.

Figure 7:
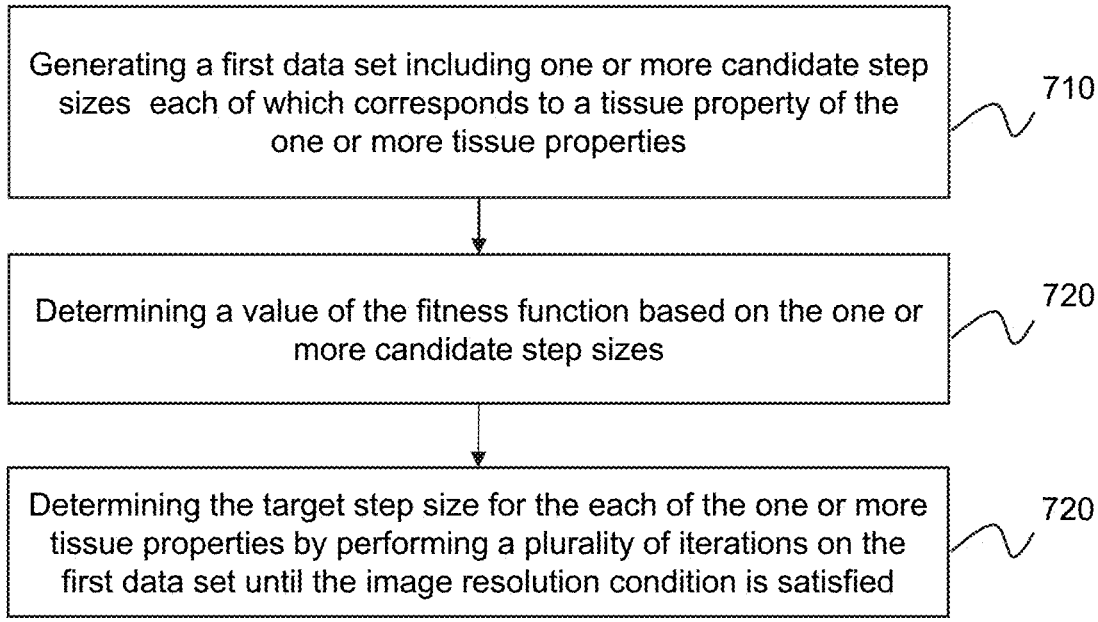
FIG. 7 is a flowchart illustrating an exemplary process for determining a target step size for each of one or more tissue properties according to some embodiments of the present disclosure.

FIG. 7 is a flowchart illustrating an exemplary process 700 for determining a target step size for each of the one or more tissue properties according to some embodiments of the present disclosure. In some embodiments, the process 700 may be implemented in the image processing system 100 illustrated in FIG. 1. For example, the process 700 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting. In some embodiments, operation 530 may be performed according to process 700.

In 710, the processing device 120 (e.g., the determining module 420) may generate a first data set.

In some embodiments, the first data set may include one or more candidate step sizes each of which corresponds to a tissue property of the one or more tissue properties. In some embodiments, the first data set may include a plurality of candidate step size combinations. Each candidate step size combination may include one or more candidate step sizes each of which corresponds to a tissue property of the one or more tissue properties. For example, the one or more tissue properties include the spin-lattice relaxation, the spin-spin relaxation, and the proton density. The candidate step size combination may include three candidate step sizes each of which corresponds to the spin-lattice relaxation, the spin-spin relaxation, and the proton density respectively. As another example, the candidate step size combination may include a candidate step size of the spin-lattice relaxation. As still another example, the candidate step size combination may include two candidate step sizes each of which corresponds to the spin-lattice relaxation and the proton density respectively. As used herein, a candidate step size of a tissue property may be a random step size of the tissue property.

In 720, the processing device 120 (e.g., the determining module 420) may determine a value of the fitness function based on the one or more candidate step sizes.

In some embodiments, the first data set may include one candidate step size combination, and the candidate step size combination may include the one or more candidate step sizes. The one or more candidate step sizes may be inputted into the fitness function (e.g., the fitness function illustrated by Equation (1) or Equation (2)), and the value of the one or more candidate step sizes may be obtained. In some embodiments, the first data set may include more than one candidate step size combination. For each of the more than one candidate step size combinations, the processing device 120 may determine a value of the fitness function based on the candidate step size(s) of the candidate step size combination. For example, the candidate step size(s) of each candidate step size combination may be inputted into the fitness function (e.g., the fitness function illustrated by Equation (1) or Equation (2)), and the value of the candidate step size combination may be obtained.

In 730, the processing device 120 (e.g., the determining module 420) may determine the target step size for the each of the one or more tissue properties by performing a plurality of iterations on the first data set until the image resolution condition is satisfied.

In some embodiments, the processing device 120 may perform the plurality of iterations on the first data set. Each of the plurality of iterations may include determining a value of the fitness function of each of the one or more candidate step sizes in the first data set; selecting, from the first data set, a candidate step size combination; transforming the candidate step size combination to obtain a second data set; and updating the first data set based on the second data set. The updated first data set may further be performed to a next iteration of a current iteration. In some embodiments, the updated first data set of a last iteration of the plurality of iterations may include one or more target step sizes each of which corresponds to a tissue property of the one or more tissue properties. In some embodiments, a condition for stopping performing the plurality of iterations may include that the image resolution condition is satisfied or a count of iterations of the plurality of iterations exceeds a first count threshold. For example, if updated candidate step size(s) in the updated first data set satisfies the image resolution condition, the processing device 120 may designate the updated candidate step size(s) in the updated first data set as the target step size for the each of the one or more tissue properties. As another example, if the count of iterations of the plurality of iterations exceeds the first count threshold, the processing device 120 may designate the updated candidate step size(s) in the updated first data set in the last as the target step size for the each of the one or more tissue properties. In some embodiments, the first count threshold may be predetermined and stored in a storage device (e.g., the storage device 130, the storage 220, the storage 390, etc.). For example, the first count threshold may be 100, 200, 300, 400, 500, 600, etc. Exemplary processes for performing the plurality of iterations may be found elsewhere (e.g., FIG. 8 and the descriptions thereof) in the present disclosure.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 8:
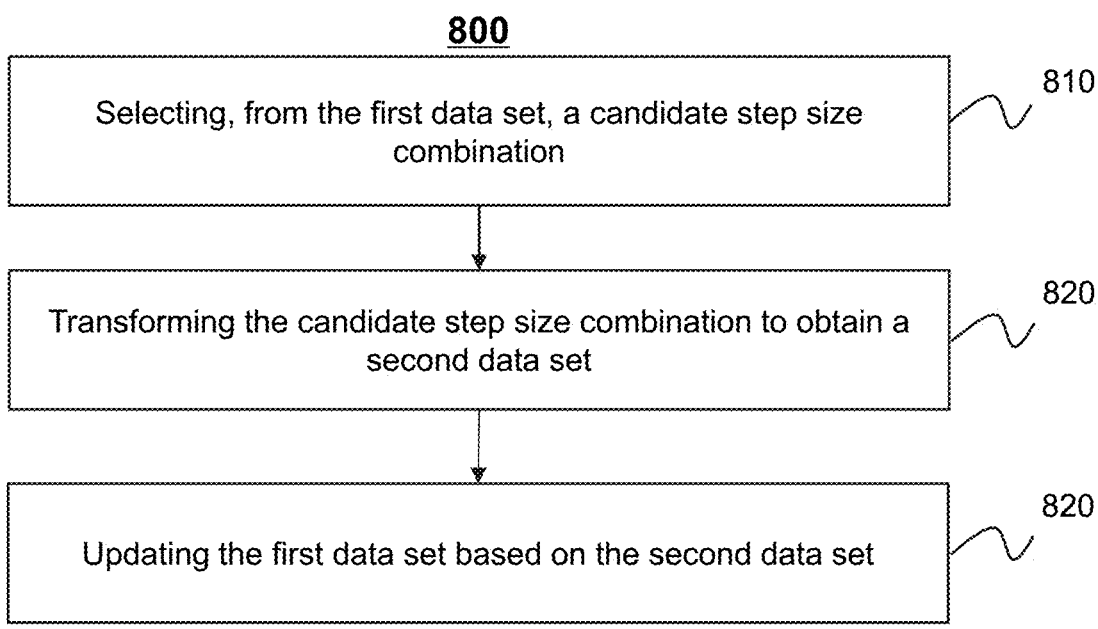
FIG. 8 is a flowchart illustrating an exemplary process for performing a plurality of iterations on a first data set according to some embodiments of the present disclosure.

FIG. 8 is a flowchart illustrating an exemplary process 800 for performing a plurality of iterations on a first data set according to some embodiments of the present disclosure. In some embodiments, the process 800 may be implemented in the image processing system 100 illustrated in FIG. 1. For example, the process 800 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting. In some embodiments, operation 730 may be performed according to process 800.

In 810, the processing device 120 (e.g., the determining module 420) may select, from the first data set, a candidate step size combination.

In some embodiments, the processing device 120 may select one or more candidate step sizes in the first data set to determine whether to remain the one or more candidate step sizes into the updated first data set or to transform the one or more candidate step sizes into the updated first data set. In some embodiments, the processing device 120 may select the candidate step size combination according to a roulette wheel selection algorithm. In some embodiments, the processing device 120 may select, from the first data set, a candidate step size combination based on a value of the candidate step size combination. The evaluation value may be associated with a candidate imaging velocity or a candidate image resolution contributed by the candidate step size combination. For example, a selecting probability of the candidate step size combination may be associated with an evaluation value relating to a candidate imaging velocity or a candidate image resolution contributed by the candidate step size combination. For example, the greater the evaluation value of a candidate step size combination that represents a higher candidate imaging velocity (or a higher candidate image resolution), the greater the selecting probability of the candidate step size combination.

In some embodiments, the processing device 120 may select, from the first data set, a candidate step size combination based on an iteration count of iterations during which the candidate step size combination is within the first data set. In some embodiments, the greater iteration counts of iterations during which the candidate step size combination is within the first data set, the greater probability that the candidate step size combination is selected to remain in the updated first data set, and the greater probability that the candidate step size combination is the target step size combination. In some embodiments, the processing device 120 may determine the iteration count of iterations during which the candidate step size combination is within the first data set, and compare the iteration count with a second count threshold. If the iteration count of iterations during which the candidate step size combination is within the first data set exceeds the second count threshold, the processing device 120 may select the candidate step size combination from the first data set. In some embodiments, the second count threshold may be predetermined and stored in a storage device (e.g., the storage device 130, the storage 220, the storage 390, etc.). For example, the second count threshold may be 20, 50, 100, etc.

In 820, the processing device 120 (e.g., the determining module 420) may transform the candidate step size combination to obtain a second data set.

In some embodiments, the processing device 120 may determine a target transformation process to transform the candidate step size combination. In some embodiments, the target transformation process may include a duplication process, a crossover process, a mutation process, or the like, or any combination thereof. In some embodiments, the duplication process may include duplicating the candidate step size combination and incorporating the duplicated candidate step size combination into the second data set. In some embodiments, the mutation process may include transforming one or more candidate step size of the candidate step size combination, and incorporating the transformed candidate step size combination into the second data set.

In some embodiments, the crossover process may include selecting, from the first data set, a second candidate step size combination to crossover with the candidate step size combination. For example, the processing device 120 may select, from the first data set, the second candidate step size combination based on a weighted evaluation value of the second candidate step size combination. In some embodiments, the weighted evaluation value may be determined based on a first evaluation value, a first weight of the first evaluation value, a second evaluation value, and a second weight of the second evaluation value. For example, the weighted evaluation value may be a sum of a product of the first evaluation value and the first weight and a product of a second evaluation value and the second weight. In some embodiments, the first evaluation value may be associated with an imaging velocity contributed by the second candidate step size combination. For example, candidate step size(s) of the second step size combination may be inputted into the fitness function (e.g., the fitness function illustrated by Equation (1) or Equation (2)), and the value of the fitness function may be designated as the first evaluation value. In some embodiments, the second evaluation value may be associated with an image resolution contributed by the second candidate step size combination. For example, the candidate step size(s) of the second step size combination may be inputted into the image resolution function (e.g., the image resolution function illustrated above), and the value of the image resolution function may be designated as the second evaluation value. In some embodiments, the first weight of the first evaluation value and the second weight of the second evaluation value may be predetermined and stored in a storage device (e.g., the storage device 130, the storage 220, the storage 390, etc.). For example, the first weight may be 0.6, and the second weight may be 0.4. In some embodiments, the processing device 120 may select a candidate step size combination of a greatest weighted evaluation value as the second candidate step size combination. In some embodiments, the processing device 120 may obtain the second data set by hybridizing the candidate step size combination and the second candidate step size combination.

In some embodiments, the processing device 120 may perform two or more target transformation processes to transform the candidate step size combination to obtain the second data set. The second data set may include a plurality of transformed step size combinations. For example, the processing device 120 may perform the duplication process, the crossover process, and the mutation process on the first data set, respectively. The second data set may include the duplicated candidate step size combination, the transformed candidate step size combination, and the hybridized candidate step size combination.

In some embodiments, the processing device 120 may determine the target transformation process to transform the candidate step size combination based on a transformation probability. The transformation probability may be a probability for transforming the candidate step size combination based on the target transformation process. In some embodiments, the transformation probability may be predetermined and stored in a storage device (e.g., the storage device 130, the storage 220, the storage 390, etc.). For example, the transformation probability of the duplication process may be 30%, the transformation probability of the crossover process may be 30%, and the transformation probability of the mutation process may be 40%. In some embodiments, the processing device 120 may select a process with a greatest transformation probability as the target transformation process, and transform the candidate step size combination based on the target transformation process. The transformed candidate step size combination may be incorporated into the second data set. In some embodiments, the transformation probability may be determined based on an evaluation value of the candidate step size combination. In some embodiments, the evaluation value may be associated with a candidate imaging velocity or a candidate image resolution contributed by the candidate step size combination. For example, the greater the candidate imaging velocity contributed by the candidate step size combination, the greater the transformation probability for transforming the candidate step size combination by the duplication process. As another example, the greater the candidate image resolution contributed by the candidate step size combination, the greater the transformation probability for transforming the candidate step size combination by the crossover process.

In 830, the processing device 120 (e.g., the determining module 420) may update the first data set based on the second data set.

In some embodiments, as described above, the first data set may include a plurality of candidate step size combinations, and the second data set may include a plurality of transformed step size combinations. In some embodiments, the processing device 120 may determine an evaluation value of each of the plurality of candidate step size combinations of the first data set. In some embodiments, the evaluation value of the each candidate step size combination may be determined based on the fitness function. For example, the each candidate step size combination of the first data set may be inputted in to the fitness function (e.g., the Equation (1) or Equation (2)), and an output value of the fitness function may be the evaluation value of the each candidate step size combination.

In some embodiments, the processing device 120 may determine a transformed evaluation value of each of the plurality of transformed step size combinations of the second data set. In some embodiments, the evaluation value of the each transformed step size combination may be determined based on the fitness function. For example, the each transformed step size combination of the second data set may be inputted into the fitness function (e.g., the Equation (1) or Equation (2)), and an output value of the fitness function may be the transformed evaluation value of the each transformed step size combination.

In some embodiments, the processing device 120 may determine an updated first data set based on the evaluation value of the each candidate step size combination of the first data set and the transformed evaluation value of the each transformed step size combination of the second data set. For example, the processing device 120 may select, from the first data set, one or more candidate step size combinations each of which has an evaluation value greater than a first threshold value. The selected one or more candidate step size combinations may be incorporated into the updated first data set. As another example, the processing device 120 may delete one or more candidate step size combinations each of which has an evaluation value less than the first threshold value from the first data set. As still another example, the processing device 120 may select, from the second data set, one or more transformed step size combinations each of which has a transformed evaluation value greater than a second threshold value. The selected one or more transformed step size combinations may be incorporated into the uprated first data set. As still another example, the processing device 120 may combine the first data set and the second data set to obtain a combined data set including a plurality of step size combinations. The processing device 120 may delete, from the combined data set, one or more step size combinations each of which has an evaluation value less than the first threshold value (or the second threshold value). In some embodiments, the first threshold value may be same with the second threshold value. In some embodiments, the updated first data set may be designated as a new first data set to be performed a next iteration as described in FIG. 7 of the present disclosure.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A system for determining a resolution of a dictionary for a magnetic resonance fingerprinting (MRF) reconstruction, comprising:
   at least one storage device including a set of instructions; and
   at least one processor in communication with the at least one storage device, wherein when executing the set of instructions, the at least one processor is directed to cause the system to perform operations including:
   obtaining one or more tissue properties;

determining an image resolution condition based on an image resolution of the MRF reconstruction; and determining, based on a fitness function and the image resolution condition, a target step size for each of the one or more tissue properties, wherein the target step size for the each of the one more tissue properties is an optimal solution of the fitness function, which represents an imaging velocity of the MRF reconstruction, and the target step size for the each of the one more tissue properties satisfies the image resolution condition.

2. The system of claim 1, wherein the determining, based on the fitness function and the image resolution condition, the target step size for the each of the one or more tissue properties includes:

generating a first data set including one or more candidate step sizes each of which corresponds to a tissue property of the one or more tissue properties;

determining a value of the fitness function based on the one or more candidate step sizes; and determining the target step size for the each of the one or more tissue properties by performing a plurality of iterations on the first data set until the image resolution condition is satisfied.

3. The system of claim 2, wherein the performing the plurality of iterations on the first data set includes:

selecting, from the first data set, a candidate step size combination;

transforming the candidate step size combination to obtain a second data set; and updating the first data set based on the second data set.

4. The system of claim 3, wherein the selecting, from the first data set, the candidate step size combination includes selecting the candidate step size combination based on an evaluation value of the candidate step size combination, wherein the evaluation value is associated with a candidate imaging velocity or a candidate image resolution contributed by the candidate step size combination.

5. The system of claim 3, wherein the selecting, from the first data set, the candidate step size combination includes selecting the candidate step size combination based on an iteration count of iterations during which the candidate step size combination is within the first data set.

6. The system of claim 3, wherein the transforming the candidate step size combination includes:

determining a target transformation process to transform the candidate step size combination based on a transformation probability; and obtaining the second data set by performing the target transformation process on the candidate step size combination.

7. The system of claim 6, wherein the transformation probability is determined based on an evaluation value of the candidate step size combination, wherein the evaluation value is associated with a candidate imaging velocity or a candidate image resolution contributed by the candidate step size combination.

8. The system of claim 6, wherein the target transformation process is a crossover process, and the obtaining the second data set by performing the target transformation process on the candidate step size combination includes:

selecting, from the first data set, a second candidate step size combination based on a weighted evaluation value of the second candidate step size combination; and obtaining the second data set by hybridizing the candidate step size combination and the second candidate step size combination.

9. The system of claim 3, wherein the updating the first data set based on the second data set includes:

determining an evaluation value of the first data set;

determining a transformed evaluation value of the second data set; and determining an updated first data set based on the evaluation value of the first data set and the transformed evaluation value of the second data set.

10. The system of claim 9, wherein an evaluation value of the first data set or a transformed evaluation value of the second data set is determined based on the fitness function.

11. The system of claim 1, wherein the fitness function includes a plurality of weights respectively corresponding to the one or more tissue properties.

12. The system of claim 1, wherein the operations further includes determining a dictionary based on the target step size for the each of the one or more tissue properties.

13. A method for determining a resolution of a dictionary for a magnetic resonance fingerprinting (MRF) reconstruction, implemented on a computing device, the computing device including at least one processor, the method comprising:

obtaining one or more tissue properties;

determining an image resolution condition based on an image resolution of the MRF reconstruction; and determining, based on a fitness function and the image resolution condition, a target step size for each of the one or more tissue properties, wherein the target step size for the each of the one more tissue properties is an optimal solution of the fitness function, which represents an imaging velocity of the MRF reconstruction, and the target step size for the each of the one more tissue properties satisfies the image resolution condition.

14. The method of claim 13, wherein the determining, based on the fitness function and the image resolution condition, the target step size for the each of the one or more tissue properties includes:

generating a first data set including one or more candidate step sizes each of which corresponds to a tissue property of the one or more tissue properties;

determining a value of the fitness function based on the one or more candidate step sizes; and determining the target step size for the each of the one or more tissue properties by performing a plurality of iterations on the first data set until the image resolution condition is satisfied.

15. The method of claim 14, wherein the performing the plurality of iterations on the first data set includes:

selecting, from the first data set, a candidate step size combination;

transforming the candidate step size combination to obtain a second data set; and updating the first data set based on the second data set.

16. The method of claim 15, wherein the selecting, from the first data set, the candidate step size combination includes selecting the candidate step size combination based on an evaluation value of the candidate step size combination, wherein the evaluation value is associated with a candidate imaging velocity or a candidate image resolution contributed by the candidate step size combination.

17. The method of claim 15, wherein the selecting, from the first data set, the candidate step size combination includes selecting the candidate step size combination based on an iteration count of iterations during which the candidate step size combination is within the first data set.

18. The method of claim 15, wherein the transforming the candidate step size combination includes:
- determining a target transformation process to transform the candidate step size combination based on a transformation probability; and
- obtaining the second data set by performing the target transformation process on the candidate step size combination.

19. The method of claim 13, wherein the fitness function includes a plurality of weights respectively corresponding to the one or more tissue properties.

20. A non-transitory computer readable medium, comprising executable instructions that, when executed by at least one processor, direct the at least one processor to perform a method for determining a resolution of a dictionary for a magnetic resonance fingerprinting (MRF) reconstruction, the method comprising:
- obtaining one or more tissue properties;
- determining an image resolution condition based on an image resolution of the MRF reconstruction; and
- determining, based on a fitness function and the image resolution condition, a target step size for each of the one or more tissue properties, wherein the target step size for the each of the one more tissue properties is an optimal solution of the fitness function, which represents an imaging velocity of the MRF reconstruction, and the target step size for the each of the one more tissue properties satisfies the image resolution condition.

* * * * *